US010684412B2

(12) United States Patent
Kraft et al.

(10) Patent No.: US 10,684,412 B2
(45) Date of Patent: Jun. 16, 2020

(54) SEMICONDUCTOR DEVICE WITH PHOTONIC AND ELECTRONIC FUNCTIONALITY AND METHOD FOR MANUFACTURING A SEMICONDUCTOR DEVICE

(71) Applicant: ams AG, Unterpremstaetten (AT)

(72) Inventors: Jochen Kraft, Bruck An Der Mur (AT); Joerg Siegert, Graz (AT)

(73) Assignee: ams AG, Unterpremstaetten (AT)

( * ) Notice: Subject to any disclaimer, the term of this patent is extended or adjusted under 35 U.S.C. 154(b) by 88 days.

(21) Appl. No.: 15/757,645

(22) PCT Filed: Aug. 25, 2016

(86) PCT No.: PCT/EP2016/070080
§ 371 (c)(1),
(2) Date: Mar. 5, 2018

(87) PCT Pub. No.: WO2017/042035
PCT Pub. Date: Mar. 16, 2017

(65) Prior Publication Data
US 2019/0025505 A1     Jan. 24, 2019

(30) Foreign Application Priority Data

Sep. 10, 2015  (EP) ..................... 15184698

(51) Int. Cl.
*G02B 6/12* (2006.01)
*H04B 10/80* (2013.01)
(Continued)

(52) U.S. Cl.
CPC ........... *G02B 6/12004* (2013.01); *G02B 6/13* (2013.01); *G02B 6/428* (2013.01); *G02B 6/43* (2013.01);
(Continued)

(58) Field of Classification Search
CPC ...... G02B 6/12004; G02B 2006/12107; G02B 6/4214; G02B 6/34; G02B 6/13;
(Continued)

(56) References Cited

U.S. PATENT DOCUMENTS

2003/0113947 A1  6/2003  Vandentop et al.
2005/0175053 A1* 8/2005  Kimura ............... H01S 5/02272
                                                            372/50.12
(Continued)

FOREIGN PATENT DOCUMENTS

WO     2004/010192 A2    1/2004

*Primary Examiner* — Ellen E Kim
(74) *Attorney, Agent, or Firm* — Fish & Richardson P.C.

(57) ABSTRACT

A semiconductor device has a semiconductor substrate and a first metallization stack arranged on the substrate. The substrate has and/or carries a plurality of electronic circuit elements. The first metallization stack has electrically insulating layers and at least one metallization layer. The semiconductor device further has a second metallization stack arranged on the first metallization stack and comprising further electrically insulating layers and an optical waveguide layer. The optical waveguide layer has at least one optical waveguide structure. Furthermore, one of the electrically insulating layers and one of the further electrically insulating layers are in direct contact with each other and form a pair of directly bonded layers.

16 Claims, 5 Drawing Sheets (51) Int. Cl.

| | | |
|---|---|---|
| *G02B 6/43* | (2006.01) | |
| *G02B 6/42* | (2006.01) | |
| *G02B 6/13* | (2006.01) | |
| *H01L 21/48* | (2006.01) | |
| *H01L 23/522* | (2006.01) | |
| *H01L 23/00* | (2006.01) | |
| *H01L 23/48* | (2006.01) | |
| *G02B 6/34* | (2006.01) | |

(52) U.S. Cl.
CPC ...... *H01L 21/4857* (2013.01); *H01L 23/5226* (2013.01); *H01L 24/08* (2013.01); *H01L 24/89* (2013.01); *H04B 10/801* (2013.01); *G02B 6/34* (2013.01); *G02B 6/4214* (2013.01); *G02B 2006/12061* (2013.01); *G02B 2006/12107* (2013.01); *H01L 23/481* (2013.01); *H01L 24/05* (2013.01); *H01L 24/06* (2013.01); *H01L 24/13* (2013.01); *H01L 24/14* (2013.01); *H01L 24/16* (2013.01); *H01L 2224/02371* (2013.01); *H01L 2224/0401* (2013.01); *H01L 2224/05548* (2013.01); *H01L 2224/05567* (2013.01); *H01L 2224/06181* (2013.01); *H01L 2224/08145* (2013.01); *H01L 2224/131* (2013.01); *H01L 2224/1403* (2013.01); *H01L 2224/14181* (2013.01); *H01L 2224/16145* (2013.01); *H01L 2224/16227* (2013.01); *H01L 2224/80896* (2013.01)

(58) Field of Classification Search
CPC ............... G02B 6/43; G02B 6/428; G02B 2006/12061; H04B 10/801; H01L 23/481; H01L 24/08; H01L 21/4857; H01L 23/5226; H01L 24/89; H01L 2224/16227; H01L 2224/14181; H01L 2224/1403; H01L 2224/131; H01L 2224/06181; H01L 2224/05567; H01L 2224/05548; H01L 2224/0401; H01L 24/16; H01L 24/14; H01L 24/13; H01L 24/06; H01L 24/05; H01L 2224/02371; H01L 2224/16145; H01L 2224/08145; H01L 2224/80896

See application file for complete search history.

(56) References Cited

U.S. PATENT DOCUMENTS

| | | | |
|---|---|---|---|
| 2005/0195472 A1* | 9/2005 | Tang | H01S 3/0632 359/333 |
| 2008/0080809 A1 | 4/2008 | Kushiyama et al. | |
| 2009/0086170 A1* | 4/2009 | El-Ghoroury | B82Y 20/00 353/38 |
| 2010/0119192 A1* | 5/2010 | Fujikata | B82Y 20/00 385/14 |
| 2010/0320496 A1 | 12/2010 | Nishi et al. | |
| 2013/0210214 A1* | 8/2013 | Dallesasse | H01L 21/8258 438/458 |
| 2013/0320567 A1* | 12/2013 | Thacker | H01L 25/0652 257/777 |
| 2014/0206176 A1 | 7/2014 | Tong et al. | |
| 2014/0269804 A1* | 9/2014 | Lai | H01S 5/0262 372/50.21 |
| 2014/0270621 A1 | 9/2014 | Dutt et al. | |
| 2014/0270629 A1* | 9/2014 | Dutt | G02B 6/43 385/14 |
| 2015/0030298 A1 | 1/2015 | Augusto | |
| 2016/0155862 A1* | 6/2016 | Hong | H01L 31/02005 257/432 |

\* cited by examiner

FIG 4

SEMICONDUCTOR DEVICE WITH PHOTONIC AND ELECTRONIC FUNCTIONALITY AND METHOD FOR MANUFACTURING A SEMICONDUCTOR DEVICE

BACKGROUND OF THE INVENTION

The present disclosure relates to the field of photonics and photonic chips. In particular, the present disclosure relates to a semiconductor device with photonic and electronic functionality and to a method for manufacturing a semiconductor device with photonic and electronic functionality.

In the field of photonics, there is a trend from long-distance signal transfer via optical fibers towards optical signal processing on-board and/or on-chip. For on-chip processing of optical signals, it may be important to have a dense stack of optical and electrical components, that is a dense stack of components with photonic functionality and electronic functionality, in particular active electronic functionality.

For example CMOS integrated circuit chips may be mounted on a silicon-on-insulator wafer comprising optical waveguides by means of metal pads and bump bonding and/or wire bonding techniques.

However, such approaches may be limited in stack density of optical and electrical components and/or may suffer from parasitic capacitances and resistances. This may also result in a reduced speed of signal transfer.

SUMMARY OF THE INVENTION

The present disclosure provides an improved concept for semiconductor devices with photonic and electronic functionality that allows for a higher stack density of optical and electronic, in particular active electronic, components and an increased speed of signal transfer.

According to the improved concept, a semiconductor device with photonic and electronic functionality is provided. The semiconductor device comprises a semiconductor substrate and a first metallization stack arranged on the substrate. The substrate comprises and/or carries a plurality of electronic circuit elements. The first metallization stack comprises electrically insulating layers and at least one metallization layer. The semiconductor device further comprises a second metallization stack arranged on the first metallization stack. In particular, the second metallization stack is arranged on a side of the first metallization stack facing away from the substrate. The second metallization stack comprises further electrically insulating layers and an optical waveguide layer. The optical waveguide layer comprises at least one optical waveguide structure. Furthermore, one of the electrically insulating layers is in direct contact with one of the further electrically insulating layers.

According to some implementations of the semiconductor device, the semiconductor substrate comprises or consists of silicon, germanium and/or another semiconductor material.

According to some implementations of the semiconductor device, the first metallization stack comprises at least two metallization layers.

According to some implementations of the semiconductor device, the first metallization stack comprises at least one inter-layer via connecting the at least two metallization layers of the first metallization stack.

According to some implementations of the semiconductor device, at least some of the electrically insulating layers and/or at least some of the further electrically insulating layers comprise or consist of silicon dioxide, silicon nitride and/or another electrically insulating material.

According to some implementations of the semiconductor device, at least some of the electrically insulating layers consist of electrically insulating sub-layers and/or at least some of the further electrically insulating layers consist of further electrically insulating sub-layers.

According to some implementations of the semiconductor device, the optical waveguide layer comprises a patterned silicon layer and/or a patterned silicon nitride layer and/or a patterned silicon dioxide layer.

According to some implementations of the semiconductor device, the at least one optical waveguide structure comprises or consists of silicon and/or silicon nitride and/or silicon dioxide.

According to some implementations of the semiconductor device, the at least one waveguide structure is designed to transfer light being injected into the at least one waveguide structure at a first region of the at least one waveguide structure to a second region of the at least one waveguide structure.

According to some implementations of the semiconductor device, the at least one waveguide structure is at least partially surrounded by one or more embedding layers of the electrically insulating layers.

According to some implementations of the semiconductor device, the at least one waveguide structure comprises or consists of a material having a first index of refraction. The one or more embedding layers comprise or consist of a material having a second index of refraction, the second index of refraction being different from the first index of refraction, in particular being smaller than the first index of refraction.

According to some implementations of the semiconductor device, there is no material, in particular no electrically conducting material, between the one of the electrically insulating layers and the one of the further electrically insulating layers being in direct contact with each other. In particular, there is no solder material or metal between said layers.

According to some implementations of the semiconductor device, the at least one metallization layer comprises or consists of a metal, for example aluminum, copper, gold or silver, an electrically conducting alloy, for example an aluminum-silicon alloy or an aluminum-copper alloy, a doped semiconductor material, for example doped silicon, for example doped polycrystalline silicon, or another electrically conductive material.

Above and in the following, the expression "metallization" refers to a functionality of electrically connecting elements of the semiconductor device. In particular, the at least one metallization layer may not necessarily comprise a metal, for example in implementations, where the at least one metallization layer comprises or consists of a doped semiconductor material.

Above and in the following, the expression "light" refers to ultraviolet, visible and/or infrared light.

Above and in the following, the expression "optical" refers to light, that is to ultraviolet, visible and/or infrared light. In particular, the optical waveguide structure refers to a structure, in particular a waveguide structure, designed to guide waves of light. Analogously, the optical waveguide layer refers to a layer comprising at least one component designed to guide waves of light, in particular the optical waveguide structure.

Above and in the following, the expressions "photonic" and "photonic functionality" refer to a functionality of processing light. Therein, the processing of light comprises for example guiding of waves of light, in particular by means of the optical waveguide layer and/or the optical waveguide structure. The processing of light may for example also comprise generating an electrical output signal and/or a light output signal based on a light input signal.

According to some implementations of the semiconductor device, the second metallization stack comprises at least one further metallization layer.

According to some implementations of the semiconductor device, the second metallization stack comprises the at least one further metallization layer and the semiconductor device further comprises at least one opening extending at least partially through the first metallization stack and at least partially through the second metallization stack. Therein, the at least one opening exposes, in particular partially exposes, a first metallization layer of the at least one metallization layer and the second metallization layer of the at least one further metallization layer. Furthermore, the first and the second metallization layer are electrically connected by a connection material covering the at least one opening at least partially. In particular, the connection material covers at least partially an exposed portion of the first metallization layer and an exposed portion of the second metallization layer.

According to some implementations of the semiconductor device, the at least one further metallization layer comprises or consists of a metal, for example aluminum, copper, gold or silver, an electrically conducting alloy, for example an aluminum-silicon alloy or an aluminum-copper alloy, a doped semiconductor material, for example doped silicon, for example doped polycrystalline silicon, or another electrically conductive material.

According to some implementations of the semiconductor device, the connection material is electrically conductive. In particular, the connection material comprises or consists of a metal, for example aluminum, copper, gold or silver, an electrically conducting alloy, for example an aluminum-silicon alloy or an aluminum-copper alloy, a doped semiconductor material, for example doped silicon, for example doped polycrystalline silicon, or another electrically conductive material.

According to some implementations of the semiconductor device, the second metallization stack comprises at least two further metallization layers.

According to some implementations of the semiconductor device, the second metallization stack comprises at least one further inter-layer via connecting the at least two further metallization layers.

According to some implementations of the semiconductor device, the at least one opening extends throughout the first metallization stack and partially through the second metallization stack.

According to some implementations of the semiconductor device, the at least one opening extends partially through the first metallization stack and throughout the second metallization stack.

According to some implementations of the semiconductor device, a first part of the at least one opening extends throughout the first metallization stack and partially through the second metallization stack and exposes the second metallization layer of the at least one further metallization layer. A second part of the at least one opening extends partially through the first metallization stack and exposes the first metallization layer of the at least one metallization layer.

According to some implementations of the semiconductor device, a first part of the at least one opening extends throughout the second metallization stack and partially through the first metallization stack and exposes the first metallization layer of the at least one metallization layer. A second part of the at least one opening extends partially through the second metallization stack and exposes the second metallization layer of the at least one further metallization layer.

According to some implementations of the semiconductor device, the first and the second metallization layer being electrically connected by the connection material overlap each other at least partially. In particular, the first and the second metallization layer overlap each other according to a line of vision perpendicular to the first and/or the second metallization layer.

According to some implementations of the semiconductor device, the first and the second metallization stack are electrically connected exclusively by the connection material.

According to some implementations of the semiconductor device, the semiconductor device further comprises at least one optical coupling component designed to receive a beam of incoming light from outside of the semiconductor device and to feed a light input signal into the at least one optical waveguide structure based on the received beam of incoming light. Therein the expression "optical" refers to the ability of the optical coupling component to receive light and feed light into the at least one optical waveguide structure.

According to some implementations of the semiconductor device, the optical coupling component is designed to receive the beam of incoming light from an external light source, the external light source being external to the semiconductor device.

According to some implementations of the semiconductor device, the optical coupling component is comprised by the optical waveguide layer and/or the optical waveguide structure.

According to some implementations of the semiconductor device, the optical coupling component is implemented as a tapered structure of the optical waveguide structure and/or comprises a diffraction grating.

According to some implementations of the semiconductor device, the semiconductor device further comprises at least one optical processing component designed to process the light input signal and to generate an electrical output signal and/or a light output signal based on the processing of the light input signal. Therein the expression "optical" refers to the ability of the optical processing component to process light.

According to some implementations of the semiconductor device, the at least one optical processing component comprises at least one of the following: a photodiode, an optical filter, an optical modulator, an optical demodulator, an optical sensor, an optical interference arrangement, an optical switch, an arrayed waveguide grating, AWG, an optical multiplexer, an optical de-multiplexer, an inverse optical multiplexer.

According to some implementations of the semiconductor device, the second metallization stack, in particular the at least one further metallization layer, electrically connects the at least one optical processing component and at least one circuit element of the plurality of electronic circuit elements.

According to some implementations of the semiconductor device, the second metallization stack, in particular the at least one further metallization layer, electrically connects the at least one optical processing component and the first metallization stack, in particular the at least one metallization layer.

According to some implementations of the semiconductor device, the semiconductor device comprises at least one control circuitry designed to control the at least one optical processing component. The at least one control circuitry may for example be embedded within the second metallization stack.

According to some implementations of the semiconductor device, the second metallization stack, in particular the at least one further metallization layer, electrically connects the at least one control circuitry and at least one of the following: the at least one optical processing component, the first metallization stack, the at least one metallization layer, at least one circuit element of the plurality of electronic circuit elements.

According to some implementations of the semiconductor device, the at least one optical processing component comprises at least a first and a second optical processing component. The second metallization stack, in particular the at least one further metallization layer, electrically connects the first and the second optical processing component.

According to some implementations of the semiconductor device, the first metallization stack, in particular the at least one metallization layer, electrically connects at least two circuit elements of the plurality of electronic circuit elements.

According to some implementations of the semiconductor device, the plurality of electronic circuit elements comprises active electronic components, in particular comprises transistor circuitry and/or a processing unit. The transistor circuitry and/or the processing unit may for example be implemented according to a CMOS technology.

According to some implementations of the semiconductor device, the semiconductor device further comprises at least one through-substrate-via, TSV, for providing an electrical contact between the first metallization stack, in particular to at least one metallization layer, and an external component. Therein, the at least one TSV extends throughout the substrate and partially through the first metallization stack.

The external component is a component being external to the semiconductor device, that is being not comprised by the semiconductor device. The external component may for example be a further semiconductor device or chip or a circuit board.

According to some implementations of the semiconductor device, the semiconductor device comprises a further substrate arranged on a side of the second metallization stack facing away from the first metallization stack.

According to some implementations of the semiconductor device, the further substrate comprises or consists of silicon, germanium and/or another semiconductor material.

According to some implementations of the semiconductor device, the semiconductor device further comprises at least one further TSV for providing an electrical contact between the second metallization stack, in particular the at least one further metallization layer, and an external component. The at least one further TSV extends throughout the further substrate and partially through the second metallization stack.

According to some implementations of the semiconductor device, the one of the electrically insulating layers and the one of the further electrically insulating layers being in direct contact with each other form a pair of directly bonded layers.

Therein, the pair of directly bonded layers results from said electrically insulating layers being connected by means of a direct bonding method.

According to some implementations of the semiconductor device, the pair of directly bonded layers is characterized in that no intermediate layer is present between the layers forming the pair of directly bonded layers. In particular, no intermediate layer is present between the one of the electrically insulating layers and the one of the further electrically insulating layers being in direct contact with each other.

In particular, no connection material, such as a solder material, a metal, an alloy, a glue or the like, is present between the layers forming the pair of directly bonded layers.

According to some implementations of the semiconductor device, a connection between the layers forming the pair of directly bonded layers is formed, in particular is exclusively formed, by intermolecular interactions between the layers forming the pair of directly bonded layers. Therein, the intermolecular interactions comprise van der Waals interactions, hydrogen bonds and/or covalent bonds.

According to the improved concept, also a method for manufacturing a semiconductor device with photonic and electronic functionality is provided. The method comprises providing a first wafer and a second wafer. The first wafer comprises a semiconductor substrate comprising a plurality of electronic circuit elements and a first metallization stack arranged on the substrate. The first metallization stack comprises electrically insulating layers and at least one metallization layer. The second wafer comprises a further substrate and a second metallization stack arranged on the further substrate. The second metallization stack comprises further electrically insulating layers and an optical waveguide layer. The optical waveguide layer comprises at least one optical waveguide structure. The method further comprises connecting the first metallization stack and the second metallization stack by means of a direct bonding method.

According to some implementations of the method, the connecting of the first metallization stack and the second metallization stack comprises planarizing a surface of one of the electrically insulating layers and a surface of one of the further electrically insulating layers. The method further comprises connecting the one of the electrically insulating layers and the one of the further electrically insulating layers by means of the direct bonding method after the planarizing.

According to some implementations of the method, the planarizing comprises chemical mechanical polishing, CMP, of the surface of the one of the electrically insulating layers and the surface of the one of the further electrically insulating layers.

According to some implementations of the method, the method further comprises at least partially removing the semiconductor substrate and/or the further substrate after the connecting of the first metallization stack and the second metallization stack.

According to some implementations of the method, the connecting of the first metallization stack and the second metallization stack comprises connecting the first and the second wafer face-to-face by means of the direct bonding method.

According to some implementations of the method, the method further comprises connecting the second wafer and the handling wafer face-to-face. The method further comprises removing the further substrate after the connecting of the second wafer to the handling wafer. The second metallization stack is then comprised by the handling wafer. The method further comprises connecting the first wafer and the handling wafer face-to-face by means of the direct bonding method.

According to some implementations of the method, the method further comprises removing the handling wafer after the connecting of the first wafer and the handling wafer.

According to some implementations of the method, the second metallization stack of the second wafer comprises at least one further metallization layer and the method further comprises opening at least one opening extending at least partially through the first metallization stack and at least partially through the second metallization stack. Therein, the at least one opening exposes, in particular partially exposes, a first metallization layer of the at least one metallization layer and a second metallization layer of the at least one further metallization layer. The method further comprises forming a connection material connecting the first and the second metallization layer covering at least partially the at least one opening.

According to some implementations of the method, the second wafer comprises at least one optical coupling component designed to receive a beam of incoming light from outside of the semiconductor device and to feed a light input signal into the at least one optical waveguide structure based on the received beam of incoming light. The method further comprises opening at least one further opening extending throughout the first metallization stack and/or partially through the second metallization stack and exposing the at least one optical coupling component.

According to some implementations of the method, the method further comprises forming at least one TSV for providing an electrical contact between the first metallization stack, in particular the at least one metallization layer, and an external component. Therein, the at least one TSV extends throughout the substrate and partially through the first metallization stack.

According to some implementations of the method, the method further comprises forming at least one further TSV for providing an electrical contact between the second metallization stack, in particular the at least one further metallization layer, and an external component. The at least one further TSV extends throughout the further substrate and partially through the second metallization stack.

According to some implementations of the method, the method further comprises opening at least one contact opening exposing, in particular partially exposing, a contact layer of the at least one metallization layer and/or a further contact layer of the at least one further metallization layer. The method further comprises forming at least one contact pad, the at least one contact pad covering at least partially an exposed portion of the contact layer and/or an exposed portion of the further contact layer.

According to some implementations of the method, the first wafer comprises at least one passivation layer arranged on a side of the substrate facing away from the first metallization stack and at least one back side contact layer embedded within the at least one passivation layer and electrically connected to the at least one TSV. The method further comprises opening at least one TSV contact opening exposing, in particular partially exposing, the at least one back side contact layer and forming an under-bump-metallization covering at least partially an exposed part of the at least one back side contact layer.

According to some implementations of the method, the second wafer comprises at least one further passivation layer arranged on a side of the further substrate facing away from the second metallization stack and at least one further back side contact layer embedded within the at least one further passivation layer and electrically connected to the at least one further TSV. The method further comprises opening at least one further TSV contact opening exposing, in particular partially exposing, the at least one further back side contact layer and forming a further under-bump-metallization covering at least partially an exposed part of the at least one further back side contact layer.

According to some implementations of the method, the method further comprises forming at least one solder bump on the under-bump-metallization and/or the further under-bump-metallization.

According to some implementations of the method, the method further comprises cutting the first and/or second wafer to obtain individual semiconductor devices.

According to some implementations of the method, the method further comprises bonding at least one of the individual semiconductor devices to an external component, such as a circuit board, an optical circuit board, another electronic device a chip or the like, by means of the at least one solder bump.

Further implementations of the method are readily derived from the various implementations of the semiconductor device and vice versa.

BRIEF DESCRIPTION OF THE DRAWINGS

In the following, the invention is explained in detail with the aid of exemplary implementations by reference to the drawings. Components that are functionally identical or have an identical effect may be denoted by identical references.

Identical components and/or components with identical effects may be described only with respect to the figure where they occur first and their description is not necessarily repeated in subsequent figures.

In the drawings.

DETAILED DESCRIPTION

Figure 1:
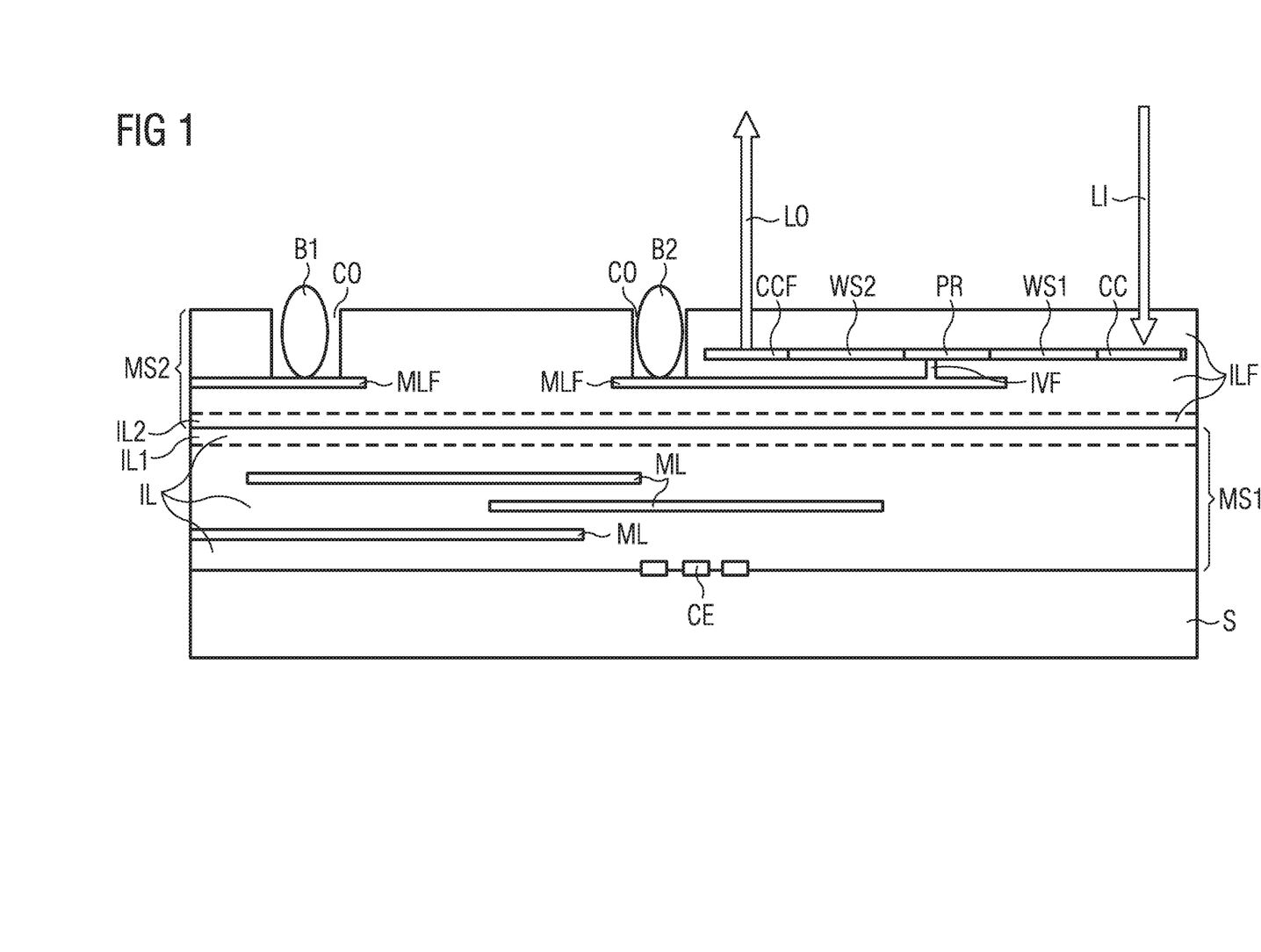
FIG. 1 shows an exemplary implementation of a semiconductor device according to the improved concept.

FIG. 1 shows an exemplary implementation of a semiconductor device according to the improved concept.

The semiconductor device comprises a semiconductor substrate S, a first metallization stack MS1 arranged on the semiconductor substrate S and a second metallization stack MS2 arranged on the first metallization stack MS1, in particular on a side of the first metallization stack MS1 facing away from the substrate S.

The substrate S comprises or carries a plurality of circuit elements CE, wherein the circuit elements CE comprise active electronic components, for example transistor circuitry. The circuit elements CE and the active electronic components may for example be implemented according to a CMOS technology.

The first metallization stack MS1 comprises electrically insulating layers IL and metallization layers ML. It is pointed out that the metallization layers ML are depicted only schematically in FIG. 1. In particular, the metallization layers ML may establish electrical interconnections between the circuit elements CE. Furthermore, at least some of the metallization layers ML may be connected to each other for example by means of inter-layer vias IV (not shown in FIG. 1, see FIG. 2).

The second metallization stack MS2 comprises further electrically insulating layers ILF and a further metallization layer MLF. The second metallization stack may also comprise more than only the one shown further metallization layer. The second metallization stack MS2 also comprises an optical waveguide layer WL, the optical waveguide layer comprising a first and a second optical waveguide structure WS1, WS2.

The second metallization stack MS2 also comprises an optical processing component PR coupled to the first and the second optical waveguide structure WS1, WS2. The optical processing component PR is for example connected to the further metallization layer MLF by means of a further inter-layer via IVF.

The second metallization stack MS2 also comprises an optical coupling component CC coupled to the first optical waveguide structure WS1 and a further optical coupling component CCF coupled to the second optical waveguide structure WS2.

The semiconductor device also comprises two contact openings CO extending partially through the second metallization stack MS2 and exposing portions of the further metallization layer MLF and two optional solder bumps B1, B2 attached to the exposed portions of the further metallization layer MLF.

One of the electrically insulating layers IL1 is arranged on a side of the first metallization stack MS1 facing the second metallization stack MS2. One of the further electrically insulating layers IL2 is arranged on a side of the second metallization stack MS2 facing the first metallization stack MS1. The one of the electrically insulating layers IL1 and the one of the further electrically insulating layers IL2 are in direct contact to each other. In particular, said layers ILL IL2 are connected to each other by means of a direct bonding method, thus forming a pair of directly bonded layers. In particular, there is no intermediate layer nor a connection material such as a solder material or an adhesive material like a glue present between said layers ILL IL2.

It is pointed out that, except for the layers ILL IL2, other layers of the electrically insulating layers IL and the further electrically insulating layers ILF are not shown as individual layers for the sake of clarity. However, it is clear to the skilled reader that the first and second metallization stack MS1, MS2 may comprise a stack of several layers including the electrically insulating layers IL, the metallization layers ML, the further electrically insulating layers ILF, the further metallization layers MLF, respectively, as well as additional layers suitable or necessary to build a semiconductor device with photonic and electronic functionality.

The further metallization layer MLF is arranged between the optical waveguide layer WL and the first metallization stack MS1. This arrangement may be achieved for example by bonding a first wafer comprising the first metallization stack MS1 and the substrate S to a second wafer comprising a further substrate and the second metallization stack MS2 face-to-face by means of the direct bonding method. The first and/or the second wafer may for example be semiconductor-on-insulator, SOI, wafers or standard semiconductor wafers, for example CMOS wafers. The further substrate and/or other layers of the second wafer not comprised by the second metallization stack MS2 are for example removed after the bonding.

The electrically insulating layers IL and/or the further electrically insulating layers ILF may for example comprise or consist of silicon dioxide. In particular, the one of the electrically insulating layers IL1 and the one of the further electrically insulating layers IL2 may comprise or consist of silicon dioxide. That is, the direct bonding of said layers ILL IL2 may involve direct bonding of two electrically insulating layers, for example silicon dioxide layers, to each other. The metallization layers ML and/or to further metallization layer MLF may for example comprise or consist of a metal or a doped semiconductor material.

The first and the second optical waveguide structure WS1, WS2 may for example comprise or consist of silicon, in particular monocrystalline silicon, or silicon nitride. Due to the higher optical refraction index of silicon or silicon nitride with respect to silicon dioxide, the first and second optical waveguide structures WS1, WS2 being embedded in the further electrically insulating layers ILF may guide light by means of total reflection within the first and second optical waveguide structures WS1, WS2, respectively.

The waveguide structures WL1, WL2 may for example be formed by patterned silicon, in particular monocrystalline silicon, embedded within the further electrically insulating layers ILF. This may for example be advantageous in case the second wafer is an SOI wafer. In this case of a layer of monocrystalline silicon of the SOI wafer may be utilized. Alternatively or in addition, the waveguide structures WL1, WL2 may for example be formed by patterned silicon nitride embedded within the further electrically insulating layers ILF. This may for example be advantageous in case the second wafer is a standard silicon wafer.

The optical coupling component CC and/or the further optical coupling component CCF may for example be implemented as grating couplers, that is they may comprise respective diffraction gratings.

In FIG. 1, also a beam of incoming light L1 is shown. The beam of incoming light IL may for example be generated by an external light source (not shown), such as a laser or a light emitting diode. If the beam of incoming light L1 is directed to a corresponding position of the semiconductor device, it may hit the optical coupling component CC. Consequently, due to the diffraction grating of the optical coupling component CC, the beam of incoming light L1 may be injected or partially injected into the first waveguide structure WS1 as a light input signal. The light input signal is then transferred through the first waveguide structure WS1 and supplied to the optical processing component PR.

The optical processing component PR may for example comprise an optical filter, an optical modulator or demodulator, an optical sensor, an optical interference arrangement, an optical switch, a photodiode, an AWG, an optical multiplexer or de-multiplexer or inverse multiplexer or the like. The optical processing component PR processes the light input signal and, based on the processing, generates for example a light output signal. The light output signal is for example supplied to the second waveguide structure WS2 and transferred through the second waveguide structure WS2 to the further optical coupling component CCF.

Due to the diffraction grating of the further optical coupling component CCF, the light output signal may be turned into a beam of outgoing light LO, which may be ejected out of the semiconductor device for example for further processing by means of an external processing device.

The second metallization stack MS2 may for example also comprise a control circuitry (not shown) connected to the further metallization layer MLF. By means of the control circuitry, for example the optical processing component PR may be controlled. Alternatively or in addition, the optical processing component may for example be controlled by the electronic circuit elements CE and/or by an external control means, for example connected to the semiconductor device via one of the solder bumps B1, B2.

The solder bumps B1, B2 may for example serve for readout and/or supply purposes and/or for connecting external control means to the semiconductor device.

Figure 2:
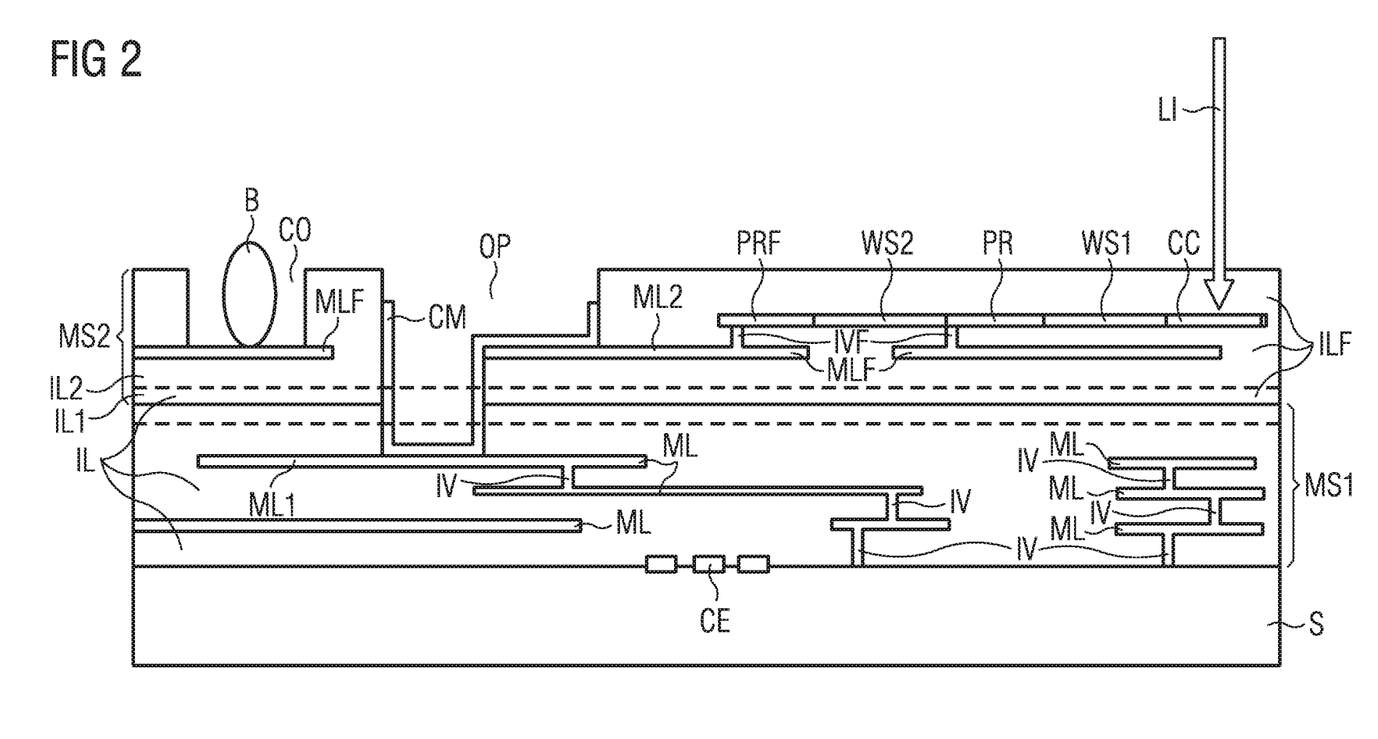
FIG. 2 shows a further exemplary implementation of a semiconductor device according to the improved concept.

FIG. 2 shows a further exemplary implementation of a semiconductor device according to the improved concept being based on the implementation of FIG. 1.

In FIG. 2, additional portions of the metallization layers ML are shown as well as inter-layer vias IV connecting different layers of the metallization layers ML. Furthermore, only one contact opening CO and one corresponding solder bump B is shown in FIG. 2.

Instead of or in addition to the further optical coupling component CCF, the semiconductor device of FIG. 2 comprises a further optical processing component PRF being connected to the second waveguide structure WS2 and to the further metallization layer MLF.

The semiconductor device also comprises an opening OP partially exposing a first metallization layer ML1 of the metallization layers ML and partially exposing a second metallization layer ML2 of the further metallization layer MLF. Since in the shown example, only one further metallization layer is shown, the second metallization layer ML2 is given by the shown further metallization layer MLF. An electrically conductive connection material CM covers the opening OP partially and in particular covers exposed parts of the first and second metallization layers ML1, ML2. In this way, the connection material CM electrically connects the first and second metallization layers ML1, ML2.

Since the first and second metallization stacks MS1, MS2 may originate from different wafers, the opening OP and the connection material may be regarded as inter-wafer connector. It is pointed out that optional additional inter-wafer connectors may additionally connect other portions of the metallization layers ML and the further metallization layer MLF than shown in FIG. 2.

The further optical processing component PRF may for example comprise a photodiode. The light output signal is for example transferred through the second waveguide structure WS2 to the further optical processing component PRF. Based on the light output signal, the further optical processing component PRF may for example generate a further electrical output signal. The further electrical output signal may be supplied via the second metallization layer ML2, the connection material CM and the metallization layers ML to at least one of the electronic circuit elements CE for further processing.

Figure 3:
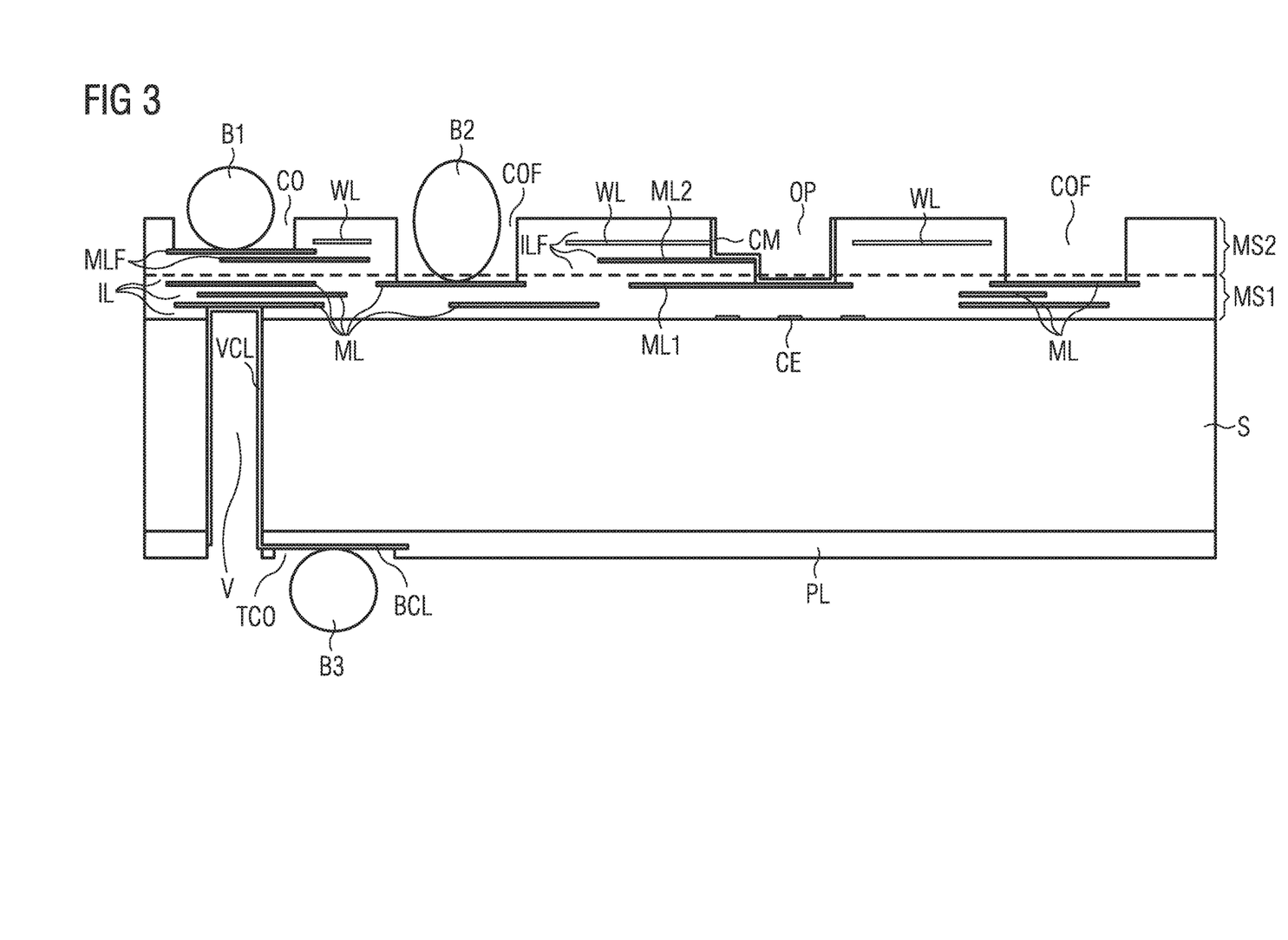
FIG. 3 shows a further exemplary implementation of a semiconductor device according to the improved concept.

FIG. 3 shows a further exemplary implementation of a semiconductor device according to the improved concept, being closely related to the implementation of FIG. 2.

The semiconductor device comprises a semiconductor substrate S, a first metallization stack MS1 arranged on the semiconductor substrate S, a second metallization stack MS2 arranged on the first metallization stack MS1 and a passivation layer PL arranged on a side of the substrate facing away from the first metallization stack MS1. The passivation layer PL consists of or comprises an electrically insulating material, for example silicon dioxide. The passivation layer PL may consist of several sub-layers.

The substrate S comprises or carries a plurality of circuit elements CE, wherein the circuit elements CE comprise active electronic components, for example transistor circuitry.

The first metallization stack MS1 comprises electrically insulating layers IL and metallization layers ML. It is pointed out that the metallization layers ML are depicted only schematically in FIG. 3. In particular, the metallization layers ML may establish electrical interconnections between the circuit elements CE. Furthermore, at least some of the metallization layers ML may be connected to each other by means of inter-layer vias IV (not shown in FIG. 3, see FIG. 2).

The second metallization stack MS2 comprises further electrically insulating layers ILF and further metallization layers MLF. The second metallization stack MS2 also comprises an optical waveguide layer WL, the optical waveguide layer WL comprising at least one optical waveguide structure.

The second metallization stack MS2 may also comprise an optical coupling component designed and arranged to receive a beam of incoming light from outside the semiconductor device and inject a light input signal into the optical waveguide layer WL and/or the at least one optical waveguide structure. Analogously to FIGS. 1 and 2, the semiconductor device may also comprise at least one optical processing component and/or a further optical coupling component. The optical waveguide layer WL and/or the at least one optical processing component may be electrically connected to the further metallization layer MLF by means of further inter-layer vias IVF (not shown in FIG. 3, see FIGS. 1 and 2).

For the sake of clarity, the at least one optical waveguide structure, the at least one optical processing component, the optical coupling component and the further optical coupling component are not shown in FIG. 3 for the sake of clarity. What has been explained in this respect in FIGS. 1 and 2 holds analogously for the implementation of FIG. 3 as far as applicable.

The semiconductor device also comprises a contact opening CO extending partially through the second metallization stack MS2 and exposing portions of the further metallization layers MLF and an optional solder bump B1 attached to the exposed portion of the further metallization layer MLF. The semiconductor device also comprises two further contact openings COF extending throughout the second metallization stack MS2 and partially through the first metallization stack MS1 and exposing portions of the metallization layer ML. An optional solder bump B2 is attached to an exposed portion of the further metallization layers MLF.

One of the electrically insulating layers IL is arranged on a side of the first metallization stack MS1 facing the second metallization stack MS2. One of the further electrically insulating layers ILF is arranged on a side of the second metallization stack MS2 facing the first metallization stack MS1. The one of the electrically insulating layers and the one of the further electrically insulating layers are in direct contact to each other. In particular, said layers are connected to each other by means of a direct bonding method, thus forming a pair of directly bonded layers.

The further metallization layer MLF is arranged between the optical waveguide layer WL and the first metallization stack MS1. This arrangement may be achieved for example by bonding the first wafer comprising the first metallization stack MS1 and the substrate S to a second wafer comprising the second metallization stack MS2 face-to-face by means of the direct bonding method. The first and/or the second wafer may for example be SOI wafers or standard semiconductor wafers, for example CMOS wafers.

The explanations regarding FIGS. 1 and 2 are analogously valid for the implementation of FIG. 3 as far as applicable.

The semiconductor device of FIG. 3 further comprises a TSV V extending throughout the passivation layer PL, throughout the substrate S and partially through the first metallization stack MS1 and exposing a portion of a layer of the metallization layers ML. An electrically conductive TSV contact layer VCL covers the TSV V and the exposed portion of the metallization layers ML at least partially.

An electrically conductive back side contact layer BCL is embedded in the passivation layer PL and connected to the TSV contact layer VCL. A TSV contact opening TCO extends partially through the passivation layer PL and exposes a portion of the back side contact layer BCL. A respective optional solder bump B3 may be attached to the exposed portion of the back side contact layer BCL. In this way an electrical contact of the metallization layers ML of the first metallization stack MS1 for example to an external component, such as another semiconductor device or chip or a circuit board, may be achieved by means of the TSV V and the back side contact layer BCL.

In a semiconductor device according to an implementation as in FIG. 3, the waveguide layer WL and the further metallization layers MLF are accessible for optical and electrical input, respectively, from the side of the second metallization stack MS2. Furthermore, by means of the further contact opening COF, also a direct electrical contact to the metallization layers ML may be possible.

Figure 4:
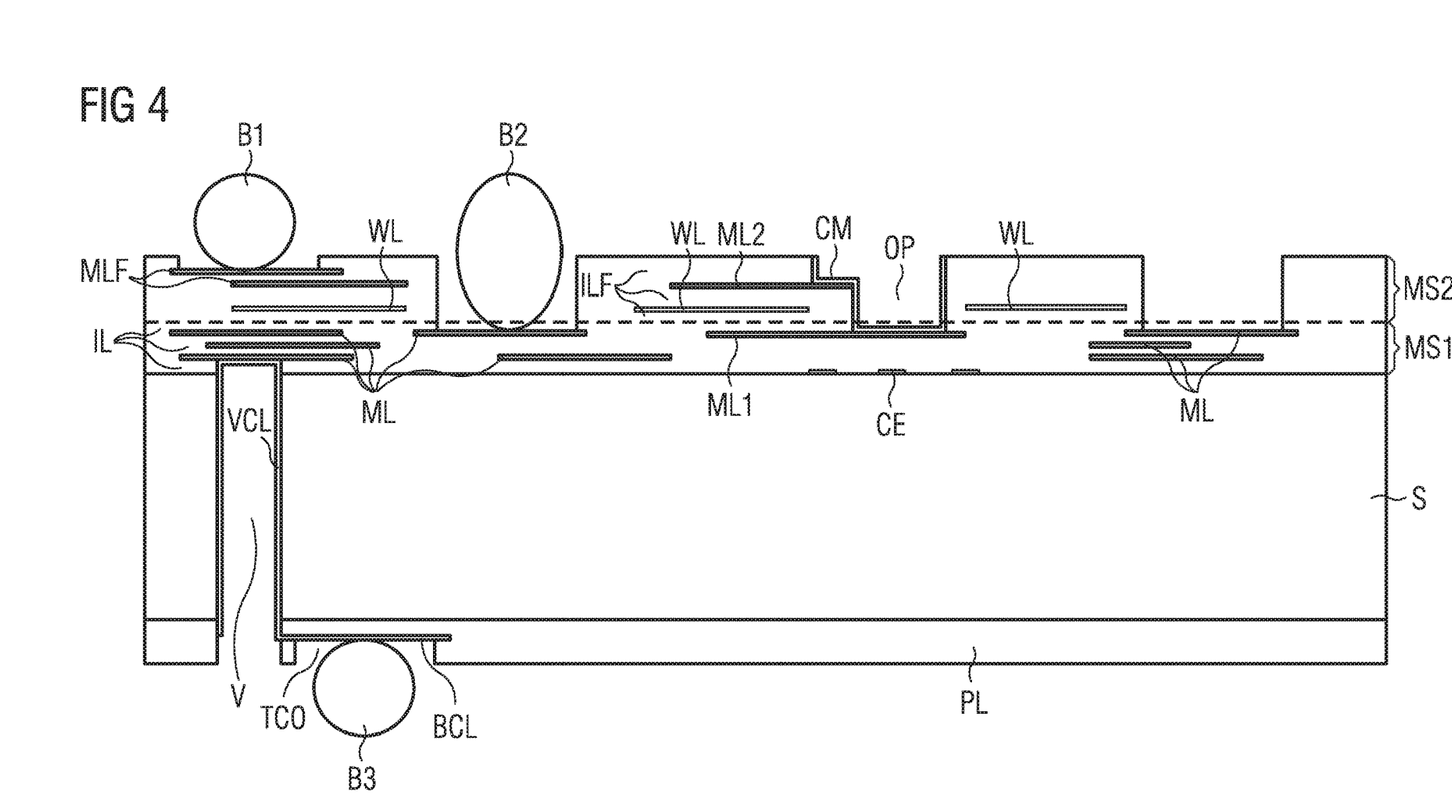
FIG. 4 shows a further exemplary implementation of a semiconductor device according to the improved concept.

FIG. 4 shows a further exemplary implementation of a semiconductor device according to the improved concept being based on the implementation of FIG. 3.

A difference between the implementations of FIGS. 3 and 4 is that in the implementation of FIG. 4, the optical waveguide layer WL is arranged between further metallization layer MLF and the first metallization stack MS1. This arrangement may be achieved for example by bonding the second wafer comprising the second metallization stack MS2 and the further substrate on which the second metallization stack MS2 is arranged to a handling wafer face-to-face. Then, the further substrate of the second wafer is for example removed. Consequently, the second metallization stack MS2 is arranged on the handling wafer. Then, the first wafer comprising the first metallization stack MS1 and the substrate S is bonded to the handling wafer face-to-face by means of the direct bonding method. The handling wafer is for example removed after the bonding. The first and/or the second wafer may for example be SOI wafers or standard semiconductor wafers, for example CMOS wafers.

Figure 5:
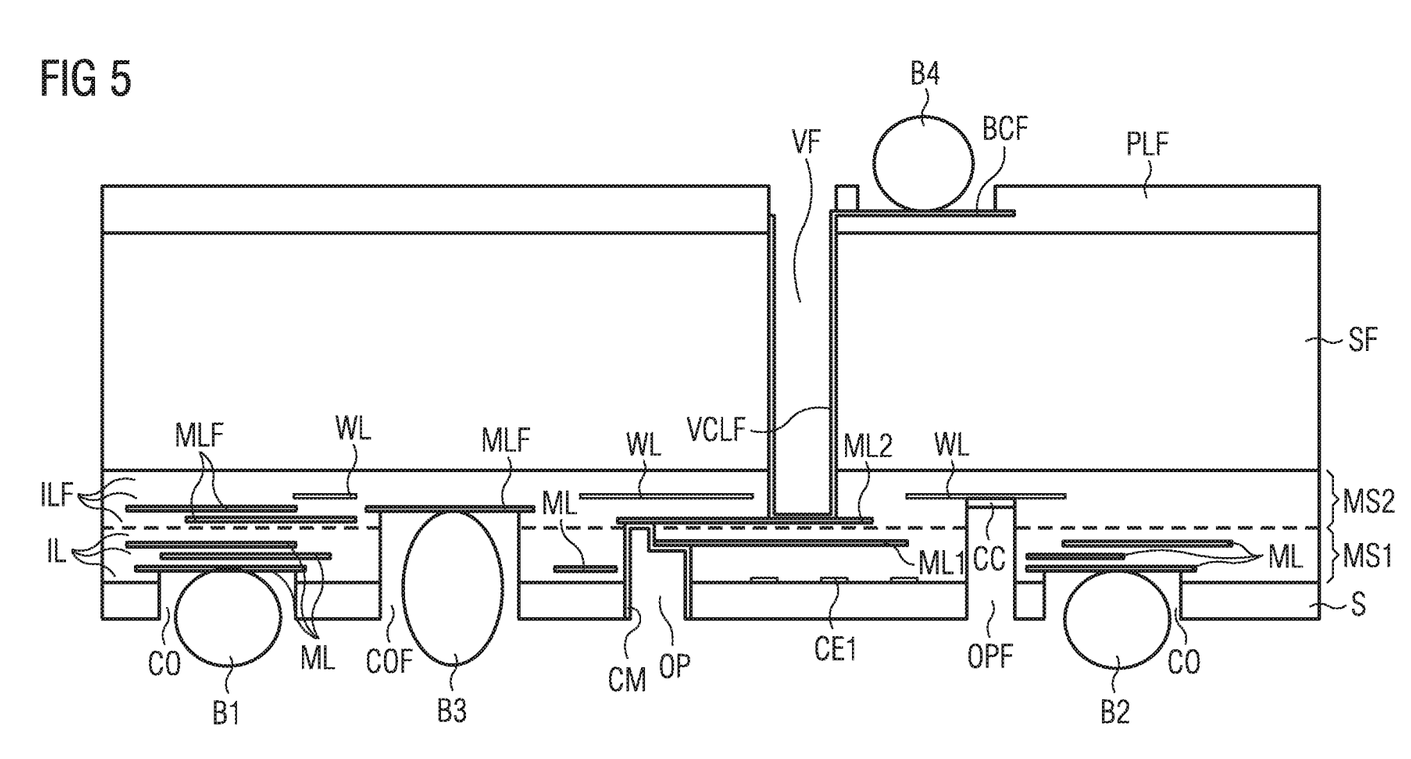
FIG. 5 shows a further exemplary implementation of a semiconductor device according to the improved concept.

FIG. 5 shows a further exemplary implementation of a semiconductor device according to the improved concept.

The semiconductor device comprises a semiconductor substrate S, a first metallization stack MS1 arranged on the semiconductor substrate S, a second metallization stack MS2 arranged on the first metallization stack MS1, a further substrate SF arranged on the second metallization stack MS2 or vice versa, and a further passivation layer PLF arranged on a side of the further substrate SF facing away from the second metallization stack MS2. The further passivation layer PLF consists of or comprises an electrically insulating material, for example silicon dioxide. The further passivation layer PLF may consist of several sub-layers.

The substrate S comprises or carries a plurality of circuit elements CE, wherein the circuit elements CE comprise active electronic components, for example transistor circuitry.

The first metallization stack MS1 comprises electrically insulating layers IL and metallization layers ML. It is pointed out that the metallization layers ML are depicted only schematically in FIG. 5. In particular, the metallization layers ML may establish electrical interconnections between the circuit elements CE. Furthermore, at least some of the metallization layers ML may be connected to each other by means of inter-layer vias IV (not shown in FIG. 5, see FIG. 2).

The second metallization stack MS2 comprises further electrically insulating layers ILF and further metallization layers MLF. The second metallization stack MS2 also comprises an optical waveguide layer WL, the optical waveguide layer WL comprising at least one optical waveguide structure.

The second metallization stack MS2 also comprises an optical coupling component CC, coupled to the waveguide layer WL. The optical coupling component CC may for example be implemented as a grating coupler, that is it may comprise a diffraction grating. The semiconductor device comprises a further opening OPF extending throughout the further substrate SF, throughout the first metallization stack MS1 and partially through the second metallization stack MS2 and exposing the optical coupling component CC.

Analogously to FIGS. 1 to 4, the semiconductor device may also comprise at least one optical processing component and/or a further optical coupling component. The optical waveguide layer WL and/or the at least one optical processing component may be electrically connected to the further metallization layer MLF by means of further inter-layer vias IVF (not shown in FIG. 3, see FIGS. 1 and 2).

For the sake of clarity, the at least one optical waveguide structure and the at least one optical processing component are not shown in FIG. 5 for the sake of clarity. What has been explained in this respect in FIGS. 1 to 4 holds analogously for the implementation of FIG. 5 as far as applicable.

A beam of incoming light (not shown) may for example be generated by an external light source (not shown), such as a laser or a light emitting diode. If the beam of incoming light is directed to a corresponding position of the semiconductor device, it may enter the further opening OPF and consequently hit the optical coupling component CC. Due to the diffraction grating of the optical coupling component CC, the beam of incoming light may be injected into the first waveguide structure WS1 as a light input signal.

The semiconductor device also comprises two contact openings CO extending throughout the further substrate SF and partially through the first metallization stack MS1 and exposing portions of the metallization layers ML and respective optional solder bumps B1, B2 attached to the exposed portions of the metallization layers ML. The semiconductor device also comprises a further contact opening COF extending throughout the further substrate SF, throughout the first metallization stack MS1 and partially through the second metallization stack MS2 and exposing a portion of the further metallization layers MLF. An optional solder bump B3 is attached to an exposed portion of the further metallization layers MLF.

One of the electrically insulating layers IL is arranged on a side of the first metallization stack MS1 facing the second metallization stack MS2. One of the further electrically insulating layers ILF is arranged on a side of the second metallization stack MS2 facing the first metallization stack MS1. The one of the electrically insulating layers and the one of the further electrically insulating layers are in direct contact to each other. In particular, said layers are connected to each other by means of the direct bonding method, thus forming a pair of directly bonded layers.

The further metallization layer MLF is arranged between the optical waveguide layer WL and the first metallization stack MS1. This arrangement may be achieved for example by bonding the first wafer comprising the first metallization stack MS1 and the substrate S to the second wafer comprising the further substrate SF and the second metallization stack MS2 face-to-face by means of the direct bonding method. The first and/or the second wafer may for example be an SOI wafer or a standard semiconductor wafer, for example a CMOS wafer. The substrate S is for example partially removed after the bonding, while the further substrate SF is for example kept. If the first wafer is an SOI wafer, an SOI-oxide of the SOI wafer may for example be used as a stop layer for the partial removal of the substrate S.

The explanations regarding FIGS. 1 to 4 are analogously valid for the implementation of FIG. 5 as far as applicable.

The semiconductor device of FIG. 5 further comprises a further TSV VF extending throughout the further passivation layer PLF, throughout the further substrate SF and partially through the second metallization stack MS2 and exposing a portion of a layer of the further metallization layers MLF. An electrically conductive further TSV contact layer VCLF covers the further TSV VF and the exposed portion of the further metallization layers MLF at least partially.

An electrically conductive further back side contact layer BCF is embedded in the further passivation layer PLF and connected to the further TSV contact layer VCLF. A further TSV contact opening TCOF extends partially through the further passivation layer PLF and exposes a portion of the further back side contact layer BCF. A respective optional solder bump B4 may be attached to the exposed portion of the further back side contact layer BCLF. In this way an electrical contact of the further metallization layers MLF of the second metallization stack MS2 for example to an external component, such as another semiconductor device or chip or a circuit board, may be achieved by means of the further TSV VF and the further back side contact layer BCF.

In a semiconductor device according to an implementation as in FIG. 5, the waveguide layer WL and the metallization layers ML are accessible for optical and electrical input, respectively, from the side of the first metallization stack MS1 and the substrate S, respectively. Furthermore, by means of the further contact opening COF, also a direct electrical contact to the further metallization layers MLF may be possible.

In the implementations of FIGS. 1 to 5, the semiconductor device may also comprise respective under-bump-metallizations (not shown) covering the exposed portions of the metallization layers ML, the further metallization layers MLF, the back side contact layer BCL and/or the further back side contact layer BCF. The respective solder bumps B, B1, B2, B3, B4 may then be attached to the respective under-bump metallization.

By means of the improved concept, an electrical, for example CMOS, portion of the semiconductor device, in particular of the first metallization stack MS1, is in direct contact with an optical portion of the semiconductor device, in particular the second metallization stack MS2, comprising the waveguide layer WL. This is achieved by connecting electrically insulating layers IL, ILF of the first and second metallization stack MS1, MS2 by means of direct bonding. Thus, no intermediate layer between the connected layers and between the first and second metallization stack MS1, MS2 is present.

By means of the inter-wafer connectors, that is by means of the opening OP and the connection material CM, the first and the second metallization stack MS1, MS2 may be connected without using bump bonds or via bonds. In this way, parasitics, such as parasitic capacitances and resistances, may be reduced or avoided by means of the improved concept. This may also result in increased speed of signal transfer.

The invention claimed is:

1. A semiconductor device with photonic and electronic functionality, comprising:
    a semiconductor substrate comprising a plurality of electronic circuit elements;
    a first metallization stack arranged on the substrate, comprising electrically insulating layers and at least one metallization layer; and
    a second metallization stack arranged on the first metallization stack, comprising further electrically insulating layers and an optical waveguide layer;
    wherein:
        the optical waveguide layer comprises at least one optical waveguide structure;
        one of the electrically insulating layers and one of the further electrically insulating layers are in direct contact with each other and form a pair of directly bonded layers; and
        there is an absence of material between the one of the electrically insulating layers and the one of the further electrically insulating layers that are in direct contact with each other.

2. The semiconductor device according to claim 1, wherein the second metallization stack comprises at least one further metallization layer and the semiconductor device further comprises at least one opening extending at least partially through the first metallization stack and at least partially through the second metallization stack, wherein
    the at least one opening exposes a first metallization layer of the at least one metallization layer and a second metallization layer of the at least one further metallization layer; and
    the first and the second metallization layer are electrically connected by a connection material covering the at least one opening at least partially.

3. The semiconductor device according to claim 1, further comprising at least one optical coupling component designed to receive a beam of incoming light from outside of the semiconductor device and to feed a light input signal into the at least one optical waveguide structure based on the received beam of incoming light.

4. The semiconductor device according to claim 3, further comprising at least one optical processing component designed to process the light input signal and to generate an electrical output signal and/or a light output signal based on the processing of the light input signal.

5. The semiconductor device according to claim 1, wherein the plurality of electronic circuit elements comprises active electronic components, in particular comprises transistor circuitry.

6. The semiconductor device according to claim 1, further comprising at least one through-substrate-via, TSV, for providing an electrical contact between the first metallization stack and an external component, wherein the at least one TSV extends throughout the substrate and partially through the first metallization stack.

7. The semiconductor device according to claim 1, further comprising a further substrate arranged on a side of the second metallization stack facing away from the first metallization stack.

8. The semiconductor device according to claim 7, further comprising at least one further TSV for providing an electrical contact between the second metallization stack and an external component, wherein the at least one further TSV extends throughout the further substrate and partially through the second metallization stack.

9. A method for manufacturing a semiconductor device with photonic and electronic functionality, the method comprising:
providing a first wafer comprising:
a semiconductor substrate comprising a plurality of electronic circuit elements; and
a first metallization stack arranged on the substrate, comprising electrically insulating layers and at least one metallization layer;
providing a second wafer comprising:
a further substrate; and
a second metallization stack arranged on the further substrate, comprising further electrically insulating layers and an optical waveguide layer, the optical waveguide layer comprising at least one optical waveguide structure; and
connecting the first metallization stack and the second metallization stack by connecting one of the electrically insulating layers and one of the further electrically insulating layers with a direct bonding method, such that there is an absence of material between the one of the electrically insulating layers and the one of the further electrically insulating layers.

10. The method according to claim 9, wherein the connecting of the first metallization stack and the second metallization stack comprises:
planarizing a surface of the one of the electrically insulating layers and a surface of the one of the further electrically insulating layers; and
connecting the one of the electrically insulating layers and the one of the further electrically insulating layers by means of the direct bonding method after the planarizing.

11. The method according to claim 9, further comprising at least partially removing the semiconductor substrate and/or the further substrate after the connecting of the first metallization stack and the second metallization stack.

12. The method according to claim 9, wherein the connecting of the first metallization stack and the second metallization stack comprises connecting the first and the second wafer face-to-face by means of the direct bonding method.

13. The method according to claim 9, further comprising:
connecting the second wafer and a handling wafer face-to-face;
removing the further substrate after the connecting of the second wafer and the handling wafer; and
connecting the first wafer and the handling wafer face-to-face by means of the direct bonding method.

14. The method according to claim 13, wherein
the second wafer comprises at least one optical coupling component designed to receive a beam of incoming light from outside of the semiconductor device and to feed a light input signal into the at least one optical waveguide structure based on the received beam of incoming light; and
the method further comprises opening at least one further opening extending throughout the first metallization stack and partially through the second metallization stack and exposing the at least one optical coupling component.

15. The method according to claim 9, wherein
the second metallization stack of the second wafer comprises at least one further metallization layer; and the method further comprises
opening at least one opening extending at least partially through the first metallization stack and at least partially through the second metallization stack, wherein the at least one opening exposes a first metallization layer of the at least one metallization layer and a second metallization layer of the at least one further metallization layer; and
forming a connection material connecting the first and the second metallization layer and covering at least partially the at least one opening.

16. A semiconductor device with photonic and electronic functionality, comprising:
a semiconductor substrate comprising a plurality of electronic circuit elements;
a first metallization stack arranged on the substrate, comprising electrically insulating layers and at least one metallization layer; and
a second metallization stack arranged on the first metallization stack, comprising further electrically insulating layers and an optical waveguide layer;
wherein:
the optical waveguide layer comprises at least one optical waveguide structure;
one of the electrically insulating layers and one of the further electrically insulating layers are in direct contact with each other and form a pair of directly bonded layers; and
there is an absence of an intermediate layer or a connection material between the one of the electrically insulating layers and the one of the further electrically insulating layers that are in direct contact with each other.

* * * * *